US012591278B2

(12) United States Patent
Wu et al.

(10) Patent No.: US 12,591,278 B2
(45) Date of Patent: Mar. 31, 2026

(54) JOINT MODULE, SERVER, AND COMPUTING SYSTEM

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 166 days.

(21) Appl. No.: 18/751,379

(22) Filed: Jun. 24, 2024

(65) Prior Publication Data

US 2025/0103110 A1 Mar. 27, 2025

(30) Foreign Application Priority Data

Sep. 22, 2023 (CN) .......................... 202311235518.9

(51) Int. Cl.
| | |
|---|---|
| *G06F 1/18* | (2026.01) |
| *G06F 1/183* | (2026.01) |
| *G06F 1/20* | (2006.01) |
| *H01R 13/502* | (2006.01) |
| *H01R 13/516* | (2006.01) |
| *H05K 7/14* | (2006.01) |

(52) U.S. Cl.
CPC ................ *G06F 1/183* (2013.01); *G06F 1/20* (2013.01); *H01R 13/502* (2013.01); *H01R 13/516* (2013.01); *H05K 7/1495* (2013.01); *H01R 2201/06* (2013.01)

(58) Field of Classification Search
CPC ...................................................... G06F 1/183
See application file for complete search history.

(56) References Cited

U.S. PATENT DOCUMENTS

| | | | | |
|---|---|---|---|---|
| 9,874,067 B2 * | 1/2018 | Themig | .................. | E21B 33/12 |
| 11,933,139 B1 * | 3/2024 | Al-Mousa | .............. | E21B 33/14 |

FOREIGN PATENT DOCUMENTS

| | | |
|---|---|---|
| CN | 106869817 A | 6/2017 |
| TW | 1802476 B | 5/2023 |

* cited by examiner

*Primary Examiner* — Jerry Wu
(74) *Attorney, Agent, or Firm* — ScienBiziP, P.C.

(57) ABSTRACT

A joint module for cutting coolant circuit in server comprises a shell, a plug connector, folding mechanism, and a switch. The plug connector is placed on the shell and movable in a first direction between a first position and a second position for connecting a plug. The folding mechanism is connected to the shell and the plug connector and is used for moving the plug connector. The switch is placed on the shell with a first condition and a second condition. When the switch is in the first condition, the folding mechanism is unfolded, the plug connector is on the first position and is connected to the plug, when the switch is in the second condition, the folding mechanism is folded, the plug connector is on the second position and is disconnected to the plug. A server and a computing system with the joint module is also disclosed.

17 Claims, 8 Drawing Sheets

100

JOINT MODULE, SERVER, AND COMPUTING SYSTEM

FIELD

The disclosure herein generally relates to information computing systems, and more particularly relates to a joint module, a server, and a computing system.

BACKGROUND

A server is installed in a rack, a plug connector is locked on a backside of the server and is connected to a plug on the rack. Coolant can flow through the plug of the server and the plug of the rack to cool the server. The coolant may be leaked from the connection between the plug of the server and the plug of the rack, and a risk of damaging the server for the leakage of the coolant.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
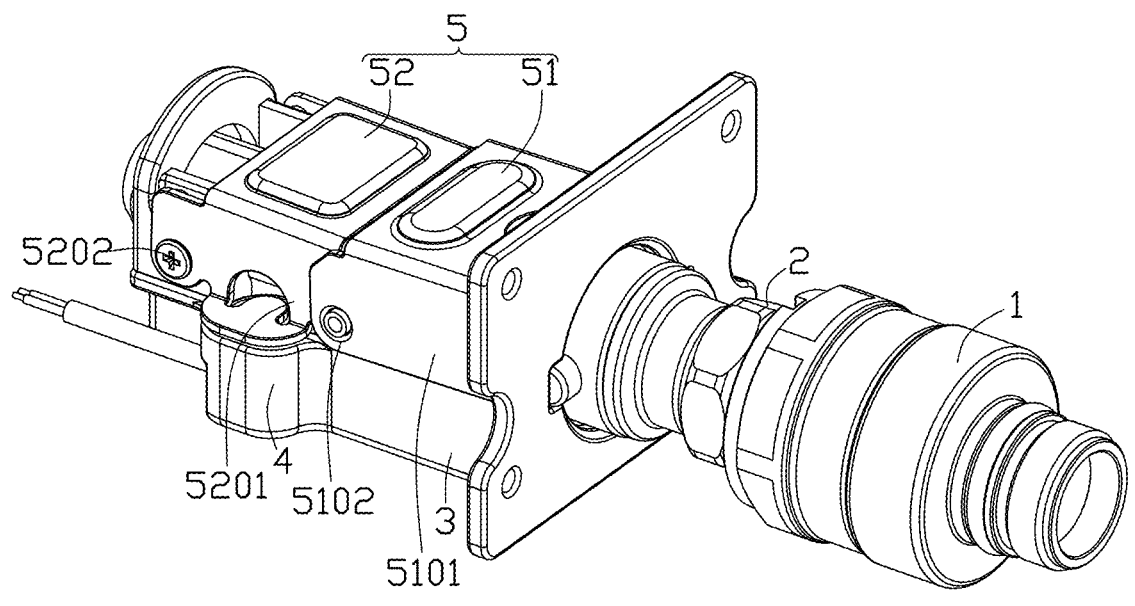
FIG. 1 is an isometric view of an embodiment of a joint module and a plug according to the present disclosure, showing the joint module and the plug are connected.
Figure 1:
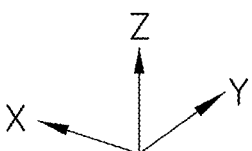

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

For computing systems, when a server is installed in a rack, a plug connector behind the server is connected to a plug on the rack, so that the rack can provide coolant to the server to cool the server. However, there is a risk of coolant leakage, and when the coolant leak in the server, if the coolant circuit is not cut in time, a large amount of coolant will enter the server, causing damage to the server.

Figure 2:
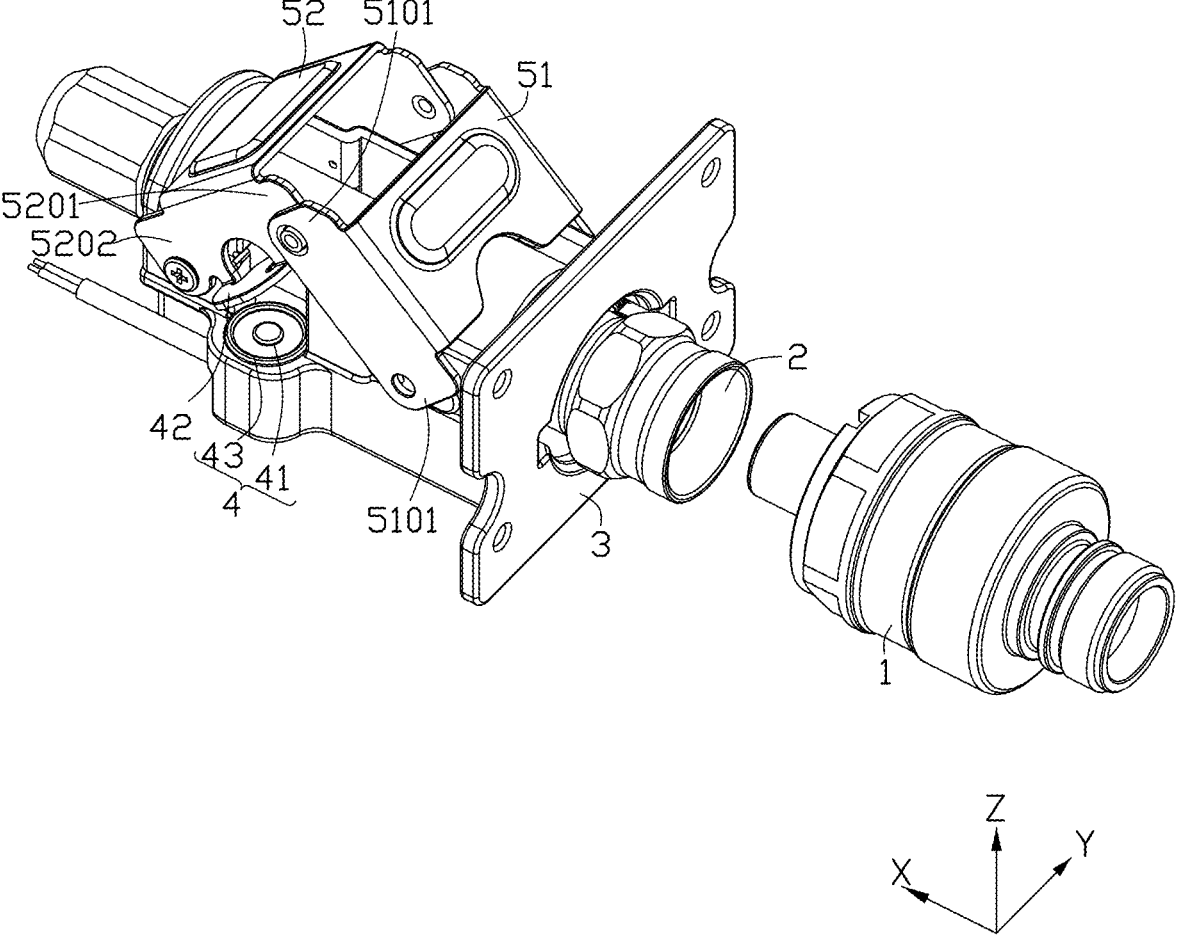
FIG. 2 is an isometric view of the joint module and the plug in FIG. 1, showing the joint module and the plug are disconnected.
Figure 3:
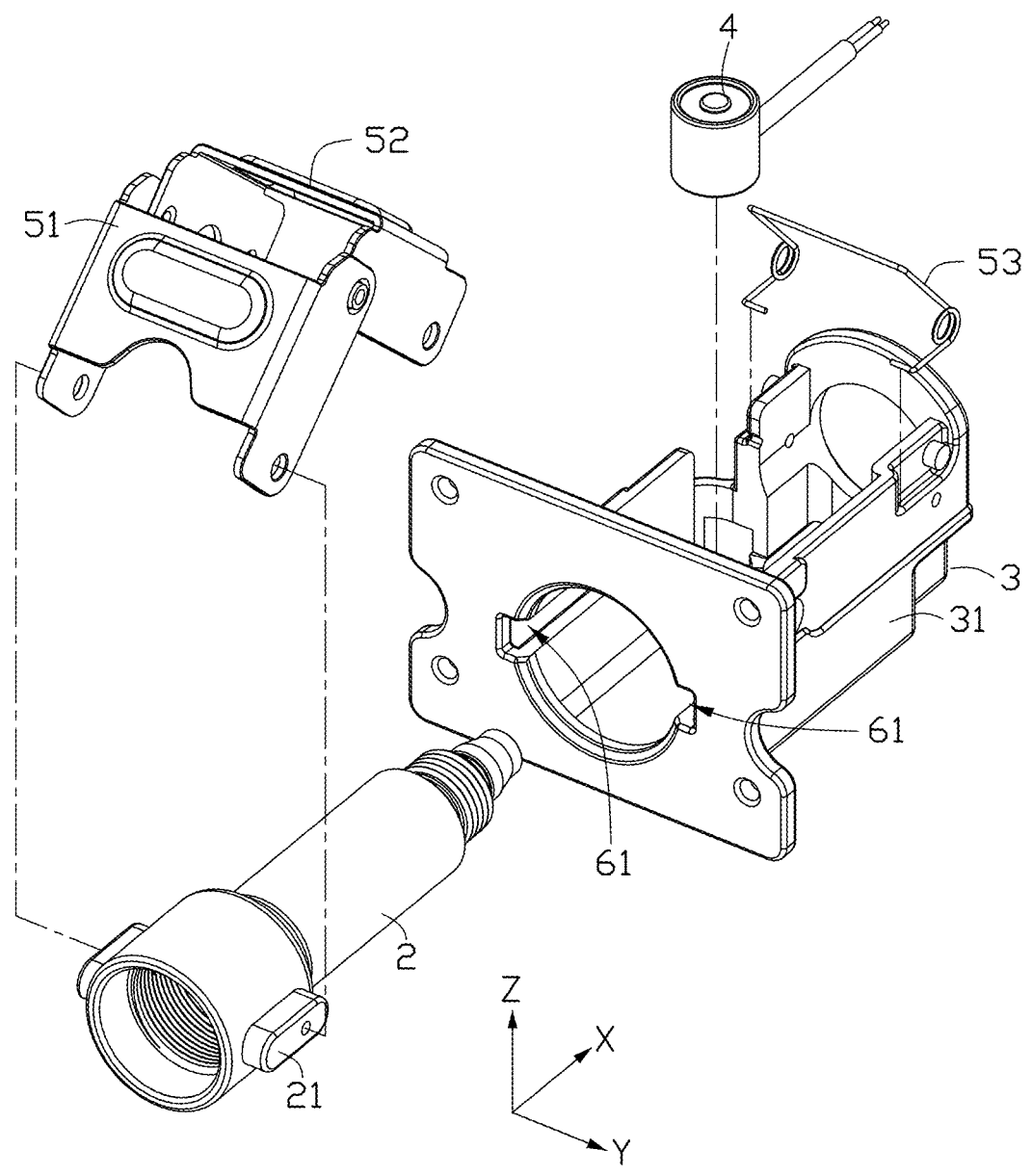
FIG. 3 is an explored view of the joint module shown in FIG. 1.
Figure 4:
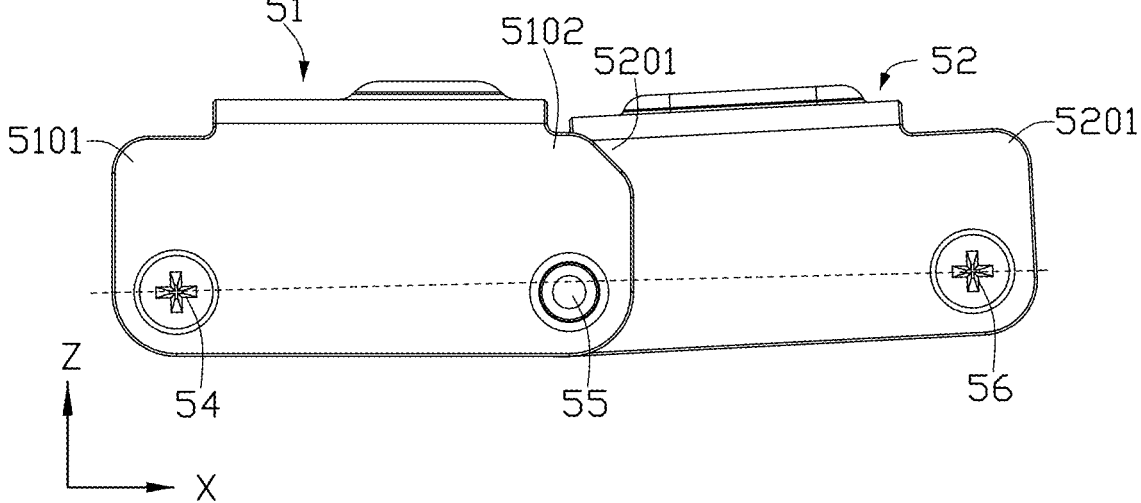
FIG. 4 is a side view of a first folding piece and a second folding piece shown in FIG. 1.
Figure 5:
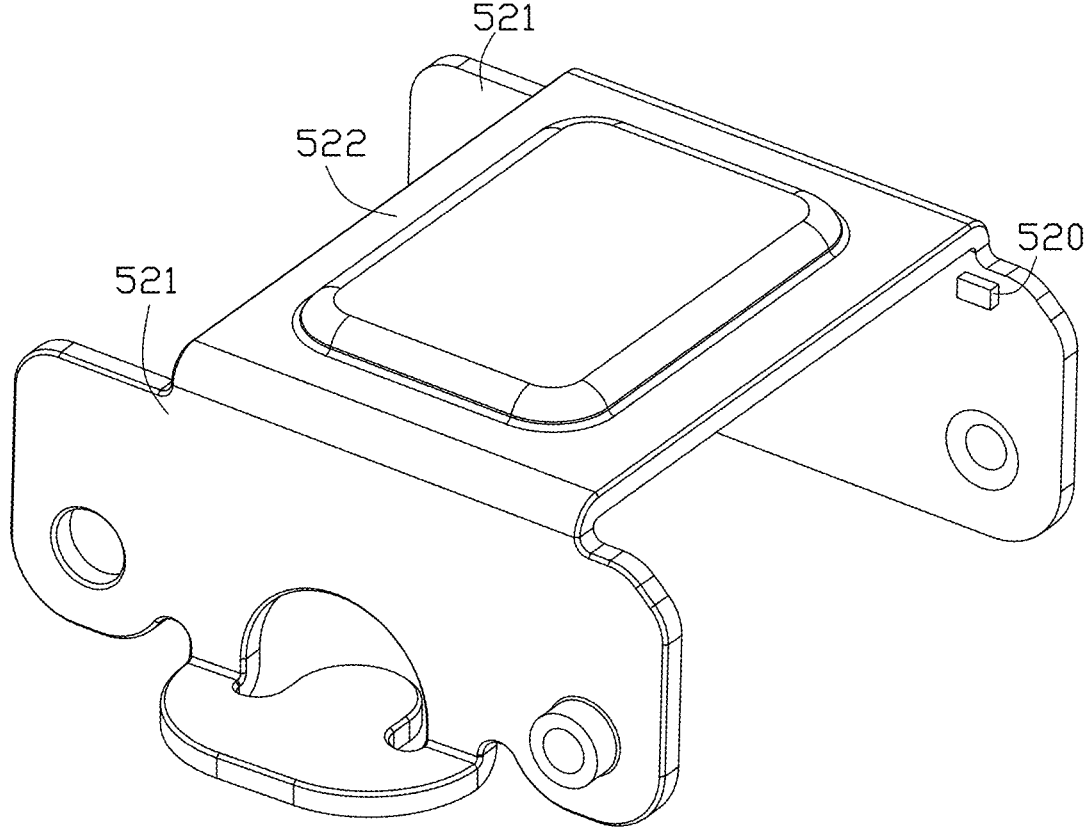
FIG. 5 is an isometric view of the second folding piece shown in FIG. 1.
Figure 6:
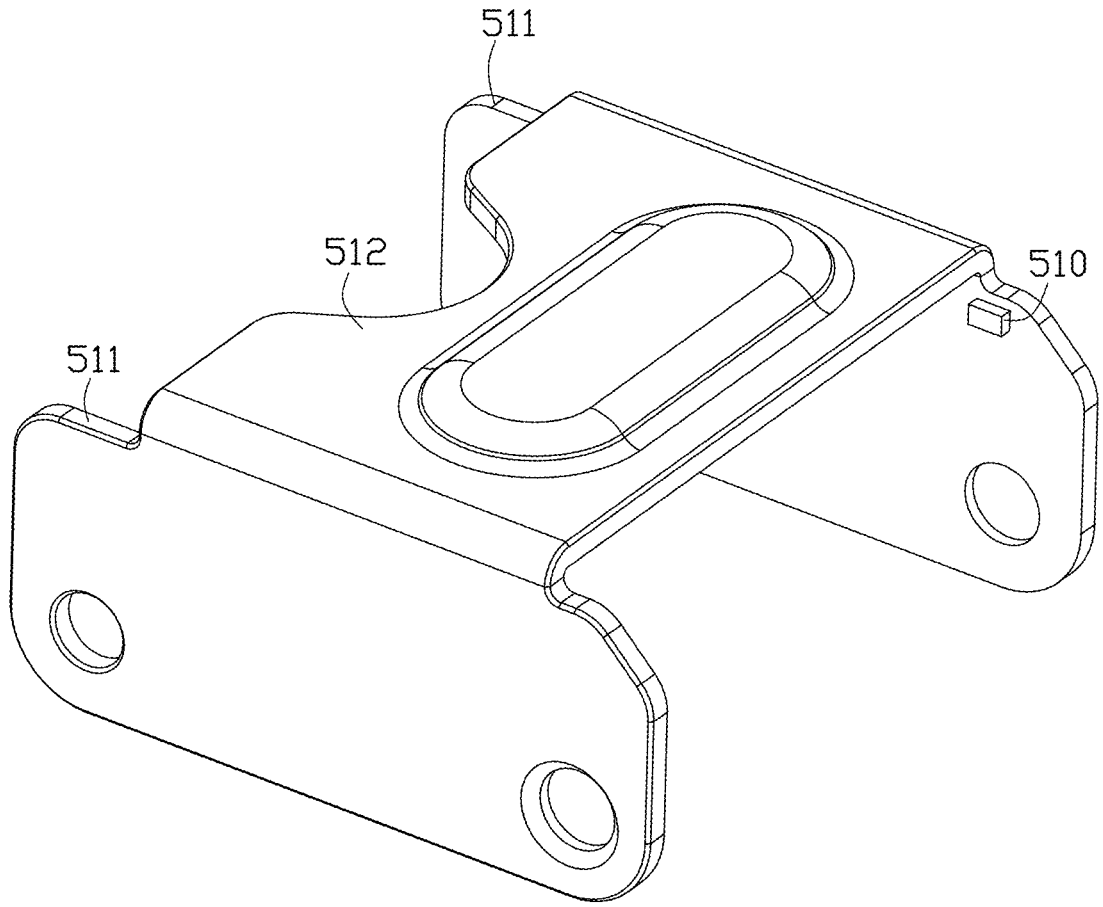
FIG. 6 is an isometric view of the first folding piece shown in FIG. 1.
Figure 7:
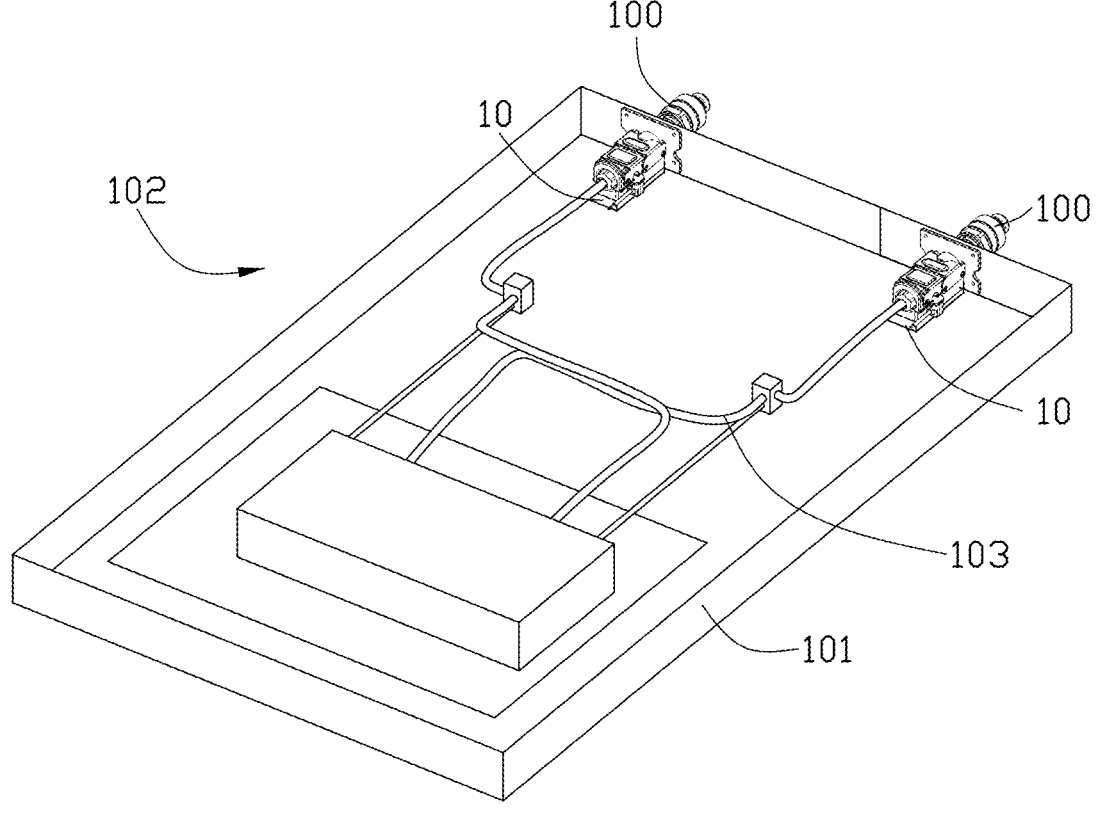
FIG. 7 is of an embodiment of a server according to the present disclosure.
Figure 8:
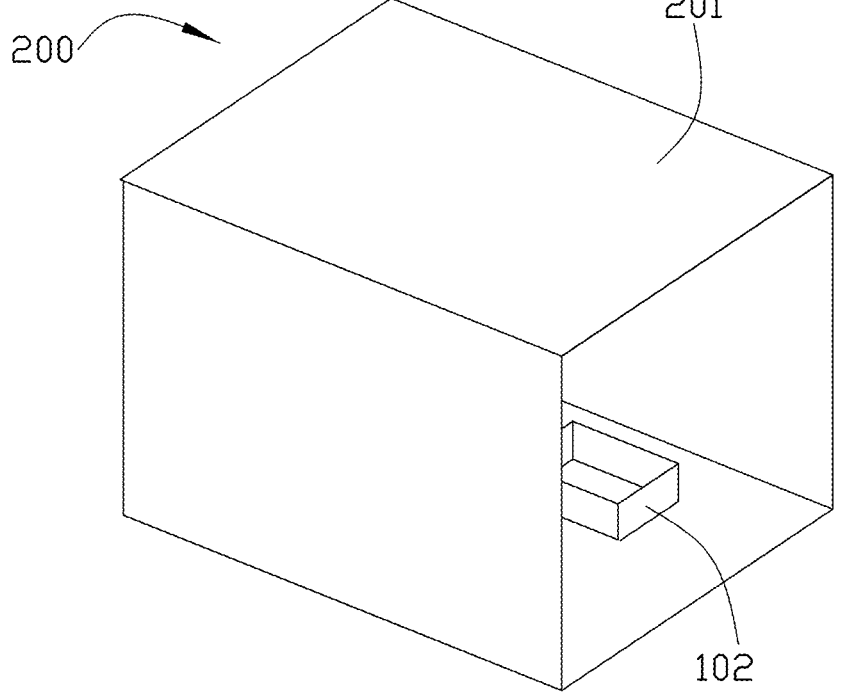
FIG. 8 is of an embodiment of a computing system according to the present disclosure.

As shown in FIG. 1 to FIG. 8, a computing system 200 in an embodiment includes a rack 201 and a plurality of servers 102. The plurality of servers 102 can be installed into the rack 201 in layers. The rack 201 includes a plurality of plugs, and there is at least one plug in each layer. Each server 102 has a plug connector 2 in the back. When one of the plurality of servers 102 is installed into the rack 201, the plug connector 2 needs to be connected to the plug in the same layer, so that the rack 201 can provide coolant to the server 102 to cool the server 102. Usually, there are two plugs in each layer in the rack 201, and there are two plug connectors 2 in the back of each server 102, when the server 102 is installed into the rack 201, the two plug connectors 2 are connected to the two plugs one-to-one, so that the coolant can be circulated between the server 102 and the rack 201.

However, there is a risk of coolant leakage, and when the coolant leak in the server 102, if the coolant circuit 103 in the server 102 is not cut in time, the coolant will enter the server 102, causing damage to the server 102.

In some embodiments, to solve the problem mentioned above, the server 102 in an embodiment includes a chassis 101, a sensor 104, and a joint module 100. The joint module 100 and the sensor 104 is located on the chassis 101. The sensor 104 is configured for sensing the coolant leakage in the server 102, if there is any coolant leakage, the joint module 100 disconnects the plug connectors 2 with the plug, to cut the coolant circuit 103 for protecting the server 102.

As shown in FIG. 1 to FIG. 6, in some embodiments, the joint module 100 in an embodiment includes a shell 3, a plug connector 2, a folding mechanism 5 and a switch 4. The plug connector 2 is placed on the shell 3 and is movable in a first direction X between a first position and a second position. The plug connector 2 is used for connecting a plug of the rack 201. The folding mechanism 5 is connected to the shell 3 and the plug connector 2, and the folding mechanism 5 is used for moving the plug connector 2 in the first direction X. The switch 4 is placed on the shell 3 with a first condition and a second condition. When the switch 4 is in the first condition, the folding mechanism 5 is unfolded, the plug connector 2 is kept on the first position and able to connect to the plug. When the switch 4 is in the second condition, the folding mechanism 5 is folded, the plug connector 2 is kept on the second position and is disconnected to the plug, to cut off the connection of the circuit 103 and the rack 201.

In some embodiments, the folding mechanism 5 includes a first folding piece 51, a second folding piece 52, and a spring 53. The first folding piece 51 has a first end 5101 and a second end 5102. The second folding piece 52 has a third end 5201 and a fourth end 5202. The first end 5101 is rotatably connected to the plug connector 2. The second end 5102 is rotatably connected to the third end 5201. The fourth end 5202 is rotatably connected to the shell 3. When the first folding piece 51 and the second folding piece 52 rotate away from each other, the folding mechanism 5 is unfolded, to move the plug connector 2 to the first position. When the first folding piece 51 and the second folding piece 52 rotate close to each other, the folding mechanism 5 is folded, to move the plug connector 2 to the second position.

The spring 53 is located between the second folding piece 52 and the shell 3. When the switch 4 is in the first condition, the folding mechanism 5 is kept unfolded, and the spring 53 is compressed. When the switch 4 is in the second condition, the folding mechanism 5 is released, so the spring 53 releases elastic potential energy to rotate the second folding piece 52, letting the first folding piece 51 and the second folding piece 52 rotate close to each other, to fold the folding mechanism 5.

In some embodiments, the switch 4 includes a first magnet 41, a second magnet 42, and a demagnetization part 43. The second magnet 42 is located on the second folding piece 52. The first magnet 41 and the demagnetization part 43 is located on the shell 3. When the switch 4 is in the first condition, the demagnetization part 43 is powered off, the first magnet 41 attracts the second folding piece 52, so the first folding piece 51 and the second folding piece 52 rotate away from each other, until the folding mechanism is unfolded, the plug connector 2 is on the first position to connect the plug 1. When the switch 4 is in the second condition, the demagnetization part 43 is powered on, the demagnetization part demagnetizes the first magnet 51, the spring 53 releases elastic potential energy to rotate the second folding piece 52, letting the first folding piece 51 and the second folding piece 52 rotate close to each other, to fold the folding mechanism 5, until the plug connector 2 is on the second position to disconnect the plug 1.

Furthermore, the first magnet 41 and the second magnet 42 is a permanent magnet, and the demagnetization part 43 is a coil. The coil is wrapped around the first magnet 41. When the coil is powered on, the coil generates magnetic poles, and the magnetic poles of the coil are opposite to the magnetic poles of the first magnet 41, so the magnetism of the first magnet 41 is weakened by the coil, to demagnetizing the first magnet 41 and release the second folding piece 52.

For another example, the demagnetization part 43 is a heater to heat the first magnet 41. When the first magnet 41 is heated to a certain temperature, the magnetism of the first magnet 41 will disappear, so to demagnetizing the first magnet 41 and release the second folding piece 52.

In some embodiments, the shell 3 includes two side walls 31. Each of the two side walls 31 defines a sliding groove 61. The plug connector 2 has two protrusions 21. Each of the two protrusions 21 is slidably placed in each of the two sliding grooves 61, for guiding the plug connector 2 moving in the first direction X.

Furthermore, the shape of the protrusion 21 is not round, so the protrusion 21 cannot rotate in the sliding groove 61, to limit the rotation of the plug connector 2.

In some embodiments, the first folding piece 51 includes a first board 512 and two first ears 511. The two first ears 511 are connected to opposite sides of the first board 512 in direction Y. The second folding piece 52 includes a second board 522 and two second ears 521. The two second ears 521 are connected to opposite sides of the second board 522 in direction Y. The two first ears 521 are rotatably connected to the plug connector 2 by a first shaft 54. The two first ears 511 are rotatably connected to the two second ears 521 by a second shaft 55. The two second ears 521 are rotatably connected to the shell 3 by a third shaft 56.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A joint module comprising: a shell fastened to a housing; a plug connector placed on the shell and movable in a first direction between a first position and a second position, the plug connector being configured for connecting a plug; a folding mechanism connected to the shell and the plug connector inside the housing, the folding mechanism being configured for moving the plug connector; and a switch placed in the housing and can be switched between a first condition or a second condition; wherein when the switch is in the first condition, the folding mechanism is unfolded, the plug connector is on the first position and is sided out of the housing and connected to the plug, when the switch is in the second condition, the folding mechanism is folded, the plug connector is on the second position and is sided toward the housing and disconnected to the plug; and the folding mechanism comprises a first folding piece and a second folding piece, the first folding piece defines a first end and a second end, the second folding piece defines a third end and a fourth end, the first end is rotatably connected to the plug connector, the second end is rotatably connected to the third end, the fourth end is rotatably connected to the shell, the first folding piece and the second folding piece rotate away from each other to unfold the folding mechanism, the first folding piece and the second folding piece rotate close to each other to fold the folding mechanism.

2. The joint module of claim 1, wherein the joint module further comprises a spring, the spring is located between the second folding piece and the shell, when the switch is in the first condition, the folding mechanism is kept unfolded, and the spring is compressed, when the switch is in the second condition, the folding mechanism is released, and the spring rotates the second folding piece to fold the folding mechanism.

3. The joint module of claim 2, wherein the switch comprises a first magnet, a second magnet, and a demagnetization part, the second magnet is located on the second folding piece, the first magnet and the demagnetization part is located on the shell, when the switch is in the first condition, the demagnetization part is powered off, the first magnet attracts the second folding piece, the folding mechanism is unfolded, when the switch is in the second condition, the demagnetization part is powered on, the demagnetization part demagnetizes the first magnet, the folding mechanism is folded by the spring.

4. The joint module of claim 1, wherein the shell comprises two side walls, each of the two side walls defines a sliding groove, the plug connector comprises two protrusions, each of the two protrusions is slidably placed in each of the two sliding grooves, for guiding the plug connector moving in the first direction.

5. The joint module of claim 1, wherein the first folding piece comprises a first board and two first ears, the two first ears are connected to opposite sides of the first board, the second folding piece comprises a second board and two second ears, the two second ears are connected to opposite sides of the second board, the two first ears are rotatably connected to the plug connector by a first shaft, the two first ears are rotatably connected to the two second ears by a second shaft, the two second ears are rotatably connected to the shell by a third shaft.

6. The joint module of claim 3, wherein the demagnetization part is a coil, when the coil is powered on, the coil generates magnetic poles opposite to magnetic poles of the first magnet.

7. A server comprising: a chassis; a sensor located on the chassis and configured for sensing a leak of coolant; and a joint module located on the chassis, the joint module comprising: a shell fastened to the chassis; a plug connector placed on the shell and movable in a first direction between a first position and a second position, the plug connector being configured for connecting a plug; a folding mechanism connected to the shell and the plug connector inside the chassis, the folding mechanism being configured for moving the plug connector; and a switch placed in the chassis and can be switched between a first condition and a second condition; wherein when the switch is in the first condition, the folding mechanism is unfolded, the plug connector is on the first position and is sided out of the chassis and connected to the plug, when the sensor senses a leak of coolant, the switch turns to the second condition, the folding mechanism is folded, the plug connector is on the second position and is sided toward the chassis and disconnected to the plug; and the shell comprises two side walls, each of the two side walls defines a sliding groove, the plug connector comprises two protrusions, each of the two protrusions is slidably placed in each of the two sliding grooves, for guiding the plug connector moving in the first direction.

8. The server of claim 7, wherein the folding mechanism comprises a first folding piece and a second folding piece, the first folding piece defines a first end and a second end, the second folding piece defines a third end and a fourth end, the first end is rotatably connected to the plug connector, the second end is rotatably connected to the third end, the fourth end is rotatably connected to the shell, the first folding piece and the second folding piece rotate away from each other to unfold the folding mechanism, the first folding piece and the second folding piece rotate close to each other to fold the folding mechanism.

9. The server of claim 8, wherein the joint module further comprises a spring, the spring is located between the second folding piece and the shell, when the switch is in the first condition, the folding mechanism is kept unfolded, and the spring is compressed, when the switch is in the second condition, the folding mechanism is released, and the spring rotates the second folding piece to fold the folding mechanism.

10. The server of claim 9, wherein the switch comprises a first magnet, a second magnet, and a demagnetization part, the second magnet is located on the second folding piece, the first magnet and the demagnetization part is located on the shell, when the switch is in the first condition, the demagnetization part is powered off, the first magnet attracts the second folding piece, the folding mechanism is unfolded, when the switch is in the second condition, the demagnetization part is powered on, the demagnetization part demagnetizes the first magnet, the folding mechanism is folded by the spring.

11. The server of claim 8, wherein the first folding piece comprises a first board and two first ears, the two first ears are connected to opposite sides of the first board, the second folding piece comprises a second board and two second ears, the two second ears are connected to opposite sides of the second board, the two first ears are rotatably connected to the plug connector by a first shaft, the two first ears are rotatably connected to the two second ears by a second shaft, the two second ears are rotatably connected to the shell by a third shaft.

12. The server of claim 10, wherein the demagnetization part is a coil, when the coil is powered on, the coil generates magnetic poles opposite to magnetic poles of the first magnet.

13. A computing system comprising: a rack comprising a plurality of plugs; and a plurality of servers placed in the rack, each of the plurality of servers comprising: a chassis; a sensor configured for sensing a leak of coolant; and a joint module located on the chassis with a spring, the joint module comprising: a shell; a plug connector placed on the shell and movable in a first direction between a first position and a second position, the plug connector being configured for connecting one of the plurality of plugs; a folding mechanism connected to the shell and the plug connector, the folding mechanism being configured for moving the plug connector; and a switch placed on the shell with a first condition and a second condition, wherein when the switch is in the first condition, the folding mechanism is unfolded, the plug connector is on the first position and is connected to the one of the plurality of plugs, when the sensor senses the leak of coolant in the chassis, the switch is in the second condition, the folding mechanism is folded, the plug connector is on the second position and disconnects the one of the plurality of plugs; and the folding mechanism comprises a first folding piece and a second folding piece; wherein the switch comprises a first magnet, a second magnet, and a demagnetization part, the second magnet is located on the second folding piece, the first magnet and the demagnetization part is located on the shell, when the switch is in the first condition, the demagnetization part is powered off, the first magnet attracts the second folding piece, the folding mechanism is unfolded, when the switch is in the second condition, the demagnetization part is powered on, the demagnetization part demagnetizes the first magnet, the folding mechanism is folded by the spring.

14. The computing system of claim 13, wherein the first folding piece defines a first end and a second end, the second folding piece defines a third end and a fourth end, the first end is rotatably connected to the plug connector, the second end is rotatably connected to the third end, the fourth end is rotatably connected to the shell, the first folding piece and the second folding piece rotate away from each other to unfold the folding mechanism, the first folding piece and the second folding piece rotate close to each other to fold the folding mechanism.

15. The computing system of claim 13, wherein the spring is located between the second folding piece and the shell, when the switch is in the first condition, the folding mechanism is kept unfolded, and the spring is compressed, when the switch is in the second condition, the folding mechanism is released, and the spring rotates the second folding piece to fold the folding mechanism.

16. The computing system of claim 13, wherein the shell comprises two side walls, each of the two side walls defines a sliding groove, the plug connector comprises two protrusions, each of the two protrusions is slidably placed in each of the two sliding grooves, for guiding the plug connector moving in the first direction.

17. The computing system of claim 14, wherein the first folding piece comprises a first board and two first ears, the two first ears are connected to opposite sides of the first board, the second folding piece comprises a second board and two second ears, the two second ears are connected to opposite sides of the second board, the two first ears are rotatably connected to the plug connector by a first shaft, the two first ears are rotatably connected to the two second ears by a second shaft, the two second ears are rotatably connected to the shell by a third shaft.

* * * * *